(12) United States Patent
Chen et al.

(10) Patent No.: US 8,835,324 B2
(45) Date of Patent: Sep. 16, 2014

(54) METHOD FOR FORMING CONTACT HOLES

(75) Inventors: Chieh-Te Chen, Kaohsiung (TW); Yi-Po Lin, Tainan (TW); Feng-Yih Chang, Tainan (TW); Chih-Wen Feng, Tainan (TW); Shang-Yuan Tsai, Kaohsiung (TW)

(73) Assignee: United Microelectronics Corp., Hsinchu (TW)

( * ) Notice: Subject to any disclaimer, the term of this patent is extended or adjusted under 35 U.S.C. 154(b) by 356 days.

(21) Appl. No.: 13/174,875

(22) Filed: Jul. 1, 2011

(65) Prior Publication Data

US 2013/0005151 A1    Jan. 3, 2013

(51) Int. Cl.
*H01L 21/311*   (2006.01)
*H01L 21/768*   (2006.01)

(52) U.S. Cl.
CPC .... *H01L 21/31144* (2013.01); *H01L 21/76816* (2013.01)
USPC .................................. 438/702; 257/E21.257

(58) Field of Classification Search
None
See application file for complete search history.

(56) References Cited

U.S. PATENT DOCUMENTS

| 6,534,414 | B1 | 3/2003 | Wang et al. |
| 6,846,618 | B2 | 1/2005 | Hsu et al. |
| 7,799,511 | B2 | 9/2010 | Chou et al. |
| 2005/0153505 | A1* | 7/2005 | Gambino et al. .............. 438/233 |
| 2005/0272237 | A1* | 12/2005 | Hautala et al. ................ 438/597 |
| 2007/0020565 | A1 | 1/2007 | Koh et al. |
| 2008/0248429 | A1 | 10/2008 | Chou et al. |
| 2009/0258500 | A1 | 10/2009 | Yang et al. |
| 2010/0304569 | A1 | 12/2010 | Chou et al. |

* cited by examiner

*Primary Examiner* — Seahvosh Nikmanesh
(74) *Attorney, Agent, or Firm* — WPAT, PC; Justin King

(57) ABSTRACT

In an exemplary method for forming contact holes, a substrate overlaid with an etching stop layer and an interlayer dielectric layer in that order is firstly provided. A first etching process then is performed to form at least a first contact opening in the interlayer dielectric layer. A first carbon-containing dielectric layer subsequently is formed overlying the interlayer dielectric layer and filling into the first contact opening. After that, a first anti-reflective layer and a first patterned photo resist layer are sequentially formed in that order overlying the carbon-containing dielectric layer. Next, a second etching process is performed by using the first patterned photo resist layer as an etching mask to form at least a second contact opening in the interlayer dielectric layer.

13 Claims, 2 Drawing Sheets

METHOD FOR FORMING CONTACT HOLES

FIELD OF THE INVENTION

The present invention generally relates to methods for forming contact holes on semiconductor devices, and more particularly to a method for forming contact holes using a double-exposure patterning technology.

BACKGROUND OF THE INVENTION

With the progress of semiconductor process and the miniaturization of microelectronics devices, the density of semiconductor devices on a wafer is increasing and correspondingly the intervals between the devices are becoming shorter and shorter, which increases the difficulty of the etching process for contact holes.

In prior art methods for forming contact holes, a photo resist layer serves as an etching mask for etching the underlying interlayer dielectric (ILD) layer. Especially for the 45 nm process, a pitch (i.e., a distance of centers of two neighboring contact holes) for contact holes must be lower than 155 nm and the "after development inspect critical dimension" (ADICD) must be around 70-80 nm. As far as the current lithographic tools of single-exposure patterning (SP) are concerned, it is impossible to create contact holes with pitch lower than 155 nm in one exposure.

In order to solve the above-mentioned problem, the current solution is to use a double-exposure patterning technology to create desired contact holes. For example, a lithography-lithography-etching (LLE) process is used, in which two exposures with two photo masks are performed on a photo resist layer and then followed by one etching step, so as to form the desired contact holes in the underlying ILD layer. Instead, a lithography-etching-lithography-etching (LELE) process can be used, in which two photo masks are respectively applied to two photo resist layers for two exposures and two etchings to transfer the photo resist patterns to a hard mask layer and then followed by one etching step, so as to form the desired contact holes in the underlying ILD layer.

However, since after developing of photo resist in the second photolithography process, the photo resist possibly is needed to be stripped off for rework due to non-uniformity of critical dimension or defocus, which would damage the pattern formed on the photo resist or hard mask by the first developing (or etching) of photo resist, so that the yield of subsequent process is degraded.

Accordingly, there is a need to provide a method for forming contact holes immune to the influence of photo resist rework, so as to improve the process yield of semiconductor device.

SUMMARY OF THE INVENTION

A method for forming contact holes in accordance with an exemplary embodiment includes steps of: providing a substrate overlaid with an etching stop layer and an interlayer dielectric layer in that order; performing a first etching process to form at least a first contact opening in the interlayer dielectric layer; forming a first carbon-containing dielectric layer overlying the interlayer dielectric layer and filling into the first contact opening; sequentially forming a first anti-reflective layer and a first patterned photo resist layer in that order overlying the carbon-containing dielectric layer; and performing a second etching process by using the first patterned photo resist layer as an etching mask to form at least a second contact opening in the interlayer dielectric layer.

In one embodiment, the formations of the first anti-reflective layer and the first patterned photo resist layer may include a photo resist rework step.

In one embodiment, the formation of the first anti-reflective layer may include steps of: firstly forming a first bottom anti-reflective coating (BARC) overlying the carbon-containing dielectric layer; and then forming a first dielectric anti-reflective coating (DARC) overlying the BARC.

In one embodiment, the formation of the first contact opening may include steps of: firstly sequentially forming a second carbon-containing dielectric layer, a second anti-reflective layer and a second patterned photo resist layer in that order overlying the interlayer dielectric layer; performing the first etching process by using the second patterned photo resist layer as an etching mask to form the first contact opening in the interlayer dielectric layer.

In one embodiment, after forming the first contact opening, the method for forming contact holes may further include a step of: stripping off the second carbon-containing dielectric layer, the second anti-reflective layer and the second patterned photo resist layer.

In one embodiment, the formation of the second anti-reflective layer may include steps of: firstly forming a second BARC overlying the second carbon-containing dielectric layer; and then forming a second DARC overlying the second BARC.

In one embodiment, the first dielectric anti-reflective coating and the second dielectric anti-reflective coating each are a silicon-containing dielectric layer. The silicon-containing dielectric layer preferably is a silicon-containing dielectric layer consisting of silicon oxide, silicon nitride, silicon carbon nitride, or the arbitrary combinations thereof. In one embodiment, the first bottom anti-reflective coating and the second bottom anti-reflective coating are made of polymer containing carbon, hydrogen and oxygen (CHO).

In one embodiment, the first contact opening and the second contact opening both penetrate through the interlayer dielectric layer and the etching stop layer and whereby the substrate is exposed.

In summary, in the above described embodiments, a novel method for forming contact holes in a semiconductor device by using twice lithography and etching process is provided. In particular, the first lithography and etching process firstly is performed to form at least one first contact opening in an interlayer dielectric layer formed overlying a semiconductor substrate, the first contact opening then is filled with a carbon-containing dielectric layer, and after that a second lithography process is carried out to sequentially form an anti-reflective layer and a patterned photo resist layer overlying the carbon-containing dielectric layer. Subsequently, a second etching process is performed to form at least one second contact opening in the interlayer dielectric layer.

Since the first contact opening formed by the first lithography and etching process is covered by the carbon-containing dielectric layer and thus would not be influenced by the second lithography and etching process. Even though the second lithography process for forming the second contact opening is needed to perform a photo resist rework step, the first contact opening still would not be damaged or the critical dimension thereof would not be enlarged. Accordingly, the issue of enlarging the contact hole critical dimension caused by the photo resist rework step in the second lithography and etching process can be solved, achieving the purpose of improving the process yield of semiconductor device.

BRIEF DESCRIPTION OF THE DRAWINGS

The above objects and advantages of the present invention will become more readily apparent to those ordinarily skilled

DETAILED DESCRIPTION OF PREFERRED EMBODIMENTS

Figure 1A:
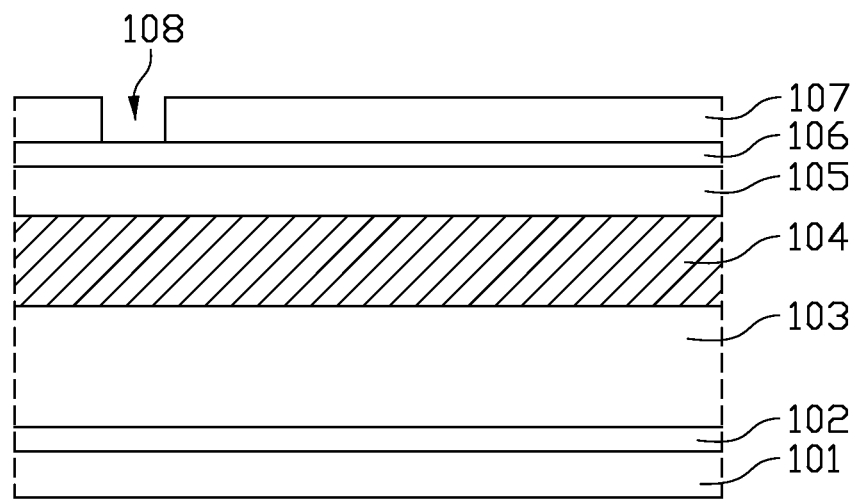
FIGS. 1A through 1D show schematic cross-sectional views of exemplary sequentially formed base structures for forming contact holes in a semiconductor device in accordance with an exemplary embodiment.

An objective of the present invention is to provide a method for forming contact holes of which the critical dimensions are immune to the influence of photo resist rework, so as to improve the process yield of semiconductor device. Hereinafter, the present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Referring to FIGS. 1A through 1D, FIGS. 1A through 1D show schematic cross-sectional views of exemplary sequentially formed base structures for forming contact holes in a semiconductor device in accordance with an exemplary embodiment. The method for forming contact holes in the illustrated embodiment may primarily include the following steps.

Firstly, a substrate 101 is provided. For example, a semiconductor substrate such as a silicon wafer or a silicon on isolator (SOI) is provided as the substrate 101.

Subsequently, an etching stop layer 102 and an interlayer dielectric layer 103 are sequentially formed overlying the substrate 101. The interlayer dielectric layer 103 can be formed by a film deposition technique such as plasma enhanced chemical vapor deposition (PECVD) process. A material of the interlayer dielectric layer 103 may be un-doped silicon oxide, doped silicon oxide such as tetra-ethyl-ortho-silicate (TEOS), borophosphosilicate glass (BPSG), fluorine silicon oxide, phosphorus silicon oxide, boron silicon oxide, low K material, ultra-low K material or any one of combinations thereof.

Afterwards, a first etching process is performed on the interlayer dielectric layer 103 to form at least a contact opening 109 in the interlayer dielectric layer 103. In a preferred embodiment, before performing the first etching process, a carbon-containing dielectric layer 104, an anti-reflective layer and a patterned photo resist layer 107 firstly are sequentially formed overlying the interlayer dielectric layer 103.

The patterned photo resist layer 107 has at least one patterned opening 108 (as shown in FIG. 1A). The carbon-containing dielectric layer 104 preferably is a hard mask formed overlying the interlayer dielectric layer 103 by plasma enhanced chemical vapor deposition process. In the illustrated embodiment, the carbon-containing dielectric layer 104 for example is an advanced patterning film (APF) provided by the Applied Materials Company. The anti-reflective layer is composed of a BARC 105 formed above the carbon-containing dielectric layer 104 and a DARC 106 formed above the BARC 105. The DARC 106 preferably is a silicon-containing dielectric layer consisting of silicon oxide, silicon nitride, silicon carbon nitride, or the arbitrary combinations thereof. The BARC 105 preferably is made of an organic material, such as a polymer containing carbon, hydrogen and oxygen (CHO), spin-coated on the carbon-containing dielectric layer 104, wherein the polymer preferably consists of ethyl lactate, 1-Methoxy-2-propyl acetate (also named as propylene glycol mono-methyl ether acetate) or the combination thereof.

In addition, in another embodiment, the patterned photo resist layer 107 for forming the contact opening 109 may be a tri-layer photo resist structure and includes a ArF photo resist layer, a silicon-containing hard mask (SHB) layer and a I-line photo resist layer sequentially stacked in that order (not shown). Correspondingly, before performing the first etching process, a pattern transfer step is firstly carried out. In particular, an exposure and developing process firstly is performed on the ArF photo resistor layer to form the patterned opening 108, and then the ArF photo resist layer is used as an etching mask to perform at least one dry etching process to thereby transfer the patterned opening 108 sequentially to the SHB layer and the I-line photo resist layer.

Next, the patterned photo resist layer 107 is used as an etching mask to perform the first etching process, so that form the at least one contact opening 109 in the interlayer dielectric layer 103. In a preferred embodiment, the first etching process is implemented by a dry etching process to make the contact opening 109 penetrate through both the interlayer dielectric layer 103 and the etching stop layer 102 and whereby the substrate 101 is exposed. In another embodiment, the contact opening 109 may only extend into the interlayer dielectric layer 103 instead rather than penetrates through both the interlayer dielectric layer 103 and the etching stop layer 102.

Figure 1B:
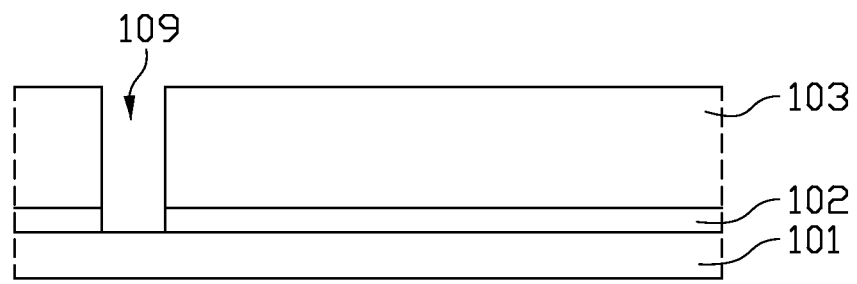

After forming the contact opening 109 by the first etching process, the patterned photo resist layer 107, the BARC 105, the DARC 106 and the carbon-containing dielectric layer 104 residual on the interlayer dielectric layer 103 are stripped off (as shown in FIG. 1B).

Then, another carbon-containing dielectric layer 110 is formed overlying the interlayer dielectric layer 103 and filled into the contact opening 109. Same as the carbon-containing dielectric layer 104, the carbon-containing dielectric layer 110 preferably is a hard mask formed by plasma enhanced chemical vapor deposition process. In the illustrated embodiment, the carbon-containing dielectric layer 110 may also be the advanced patterning film provided by the Applied Materials Company. In other embodiment, the carbon-containing dielectric layers 104, 110 may be made of different materials.

Figure 1C:
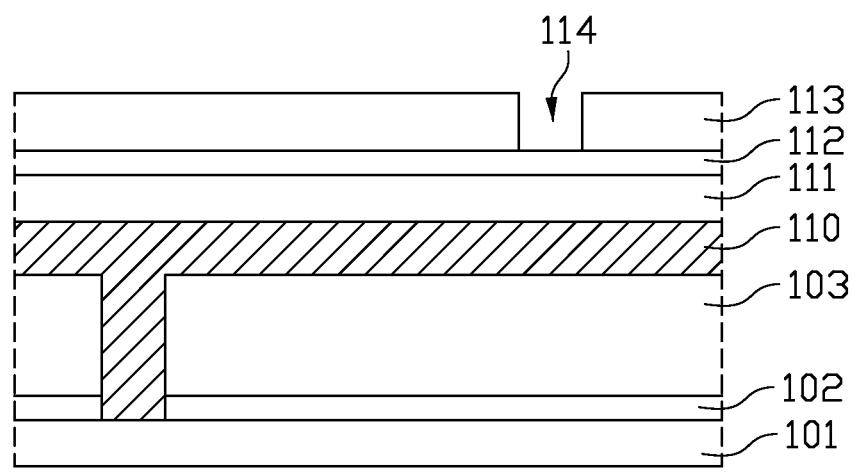

Subsequently, a BARC 111, a DARC 112 and a patterned photo resist layer 113 are sequentially formed overlying the carbon-containing dielectric layer 110. The patterned photo resist layer 113 is formed with at least one patterned opening 114 (as shown in FIG. 1C). In a preferred embodiment, the DARC 112 is a silicon-containing dielectric layer consisting of silicon oxide, silicon nitride, silicon carbon nitride, or the arbitrary combinations thereof. The BARC 111 preferably is made of an organic material, such as a polymer containing carbon, hydrogen and oxygen (CHO), spin-coated on the carbon-containing dielectric layer 110, wherein the polymer preferably consists of ethyl lactate, 1-Methoxy-2-propyl acetate or the combination thereof.

It is noted that, although in the above described embodiment, the materials of the DARC 112, the BARC 111 and the patterned photo resist layer 113 preferably are respectively the same as that of the DARC 106, the BARC 105 and the patterned photo resist layer 107, but it is not to limit the present invention. In other embodiment, the materials of the DARC 112, the BARC 111 and the patterned photo resist layer 113 may be respectively different from that of the DARC 106, the BARC 105 and the patterned photo resist layer 107; since the formation steps and materials of the patterned photo resist layers, the dielectric anti-reflective coatings and the bottom anti-reflective coatings are well-known to the skilled person in the art, and thus the related formation steps and materials are hereby omitted.

Figure 1D:
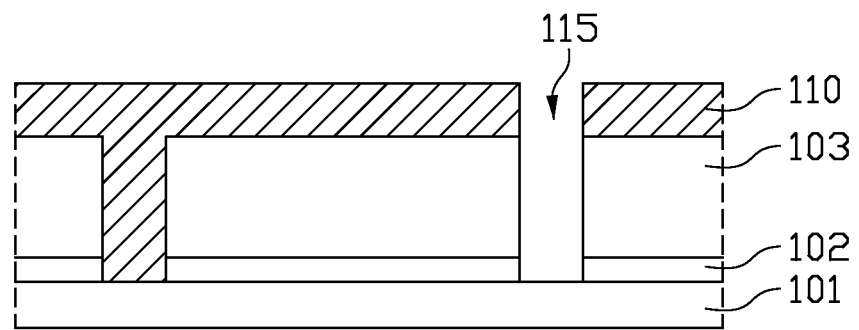

Thereafter, the patterned photo resist layer 113 is used as an etching mask to perform a second etching process, so that at least one contact opening 115 (as shown in FIG. 1D) is formed in the interlayer dielectric layer 103. In a preferred embodiment, the second etching process is implemented by a dry etching process to make the contact opening 115 penetrate through both the interlayer dielectric layer 103 and the etching stop layer 102 and whereby the substrate 101 is exposed. In other embodiment, the contact opening may only extend into the interlayer dielectric layer 103 instead rather than penetrates through both the interlayer dielectric layer 103 and the etching stop layer 102.

Figure 1E:
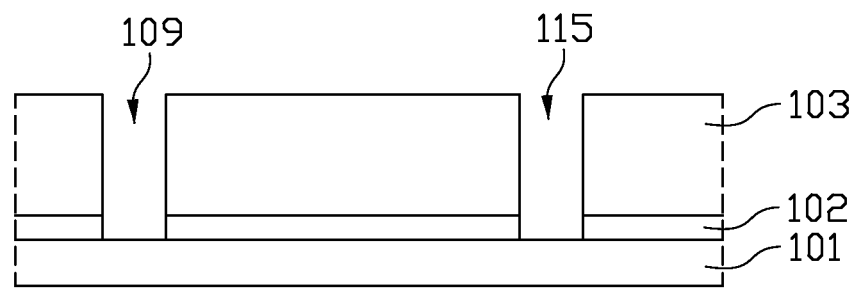
FIG. 1E shows a schematic cross-sectional view of a resultant structure with contact holes in accordance with the exemplary embodiment.

Next, the carbon-containing dielectric layer 110 residual on the interlayer dielectric layer 103 are stripped off. Accordingly, the resultant structure with contract holes (corresponding to contact openings 109, 115) as shown in FIG. 1E is obtained.

To sum up, in the above described embodiments, a novel method for forming contact holes in a semiconductor device by using twice lithography and etching process is provided. In particular, the first lithography and etching process firstly is performed to form at least one first contact opening in an interlayer dielectric layer formed overlying a semiconductor substrate, the first contact opening then is filled with a carbon-containing dielectric layer, and after that a second lithography process is carried out to sequentially form an anti-reflective layer and a patterned photo resist layer overlying the carbon-containing dielectric layer. Subsequently, a second etching process is performed to form at least one second contact opening in the interlayer dielectric layer. As shown in FIG. 1E, the first contact opening 109 and the second contact opening 115 are provided side by side in the interlayer dielectric layer.

Since the first contact opening formed by the first lithography and etching process is covered by the carbon-containing dielectric layer and thus would not be influenced by the second lithography and etching process. Even though the second lithography process for forming the second contact opening is needed to perform a photo resist rework step, the first contact opening still would not be damaged or the critical dimension thereof would not be enlarged. Accordingly, the issue of enlarging the contact hole critical dimension caused by the photo resist rework step in the second lithography and etching process can be solved, achieving the purpose of improving the process yield of semiconductor device.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A method for forming contact holes, comprising:
   providing a substrate overlaid with an etching stop layer and an interlayer dielectric layer in that order;
   performing a first etching process to form at least a first contact opening in the interlayer dielectric layer;
   forming a first carbon-containing dielectric layer overlying the interlayer dielectric layer and filling into the first contact opening;
   forming a first anti-reflective layer and a first patterned photo resist layer in that order overlying the first carbon-containing dielectric layer; and
   performing a second etching process by using the first patterned photo resist layer as an etching mask to form at least a second contact opening in the interlayer dielectric layer;
   wherein the first contact opening and the second contact opening are provided side by side in the interlayer dielectric layer.

2. The method as claimed in claim 1, wherein the formations of the first anti-reflective layer and the first patterned photo resist layer comprises a photo resist rework step.

3. The method as claimed in claim 1, wherein the formation of the first anti-reflective layer comprises:
   forming a first bottom anti-reflective coating overlying the carbon-containing dielectric layer; and
   forming a first dielectric anti-reflective coating overlying the first bottom anti-reflective coating.

4. The method as claimed in claim 3, wherein the first bottom anti-reflective coating is made of a polymer containing carbon, hydrogen and oxygen.

5. The method as claimed in claim 3, wherein the first dielectric anti-reflective coating is a silicon-containing dielectric layer.

6. The method as claimed in claim 5, wherein the silicon-containing dielectric layer consists of silicon oxide, silicon nitride, silicon carbon nitride, or the arbitrary combinations thereof.

7. The method as claimed in claim 1, wherein the formation of the first contact opening comprises:
   sequentially forming a second carbon-containing dielectric layer, a second anti-reflective layer and a second patterned photo resist layer in that order overlying the interlayer dielectric layer; and
   performing the first etching process by using the second patterned photo resist layer as an etching mask to form the first contact opening in the interlayer dielectric layer.

8. The method as claimed in claim 7, wherein after forming the first contact opening, the method further comprises:
   stripping off the second carbon-containing dielectric layer, the second anti-reflective layer and the second patterned photo resist layer.

9. The method as claimed in claim 7, wherein the formation of the second anti-reflective layer comprises:
   forming a second bottom anti-reflective coating overlying the second carbon-containing dielectric layer; and
   forming a second dielectric anti-reflective coating overlying the second bottom anti-reflective coating.

10. The method as claimed in claim 9, wherein the second bottom anti-reflective coating is made of a polymer containing carbon, hydrogen and oxygen.

11. The method as claimed in claim 9, wherein the second dielectric anti-reflective coating is a silicon-containing dielectric layer.

12. The method as claimed in claim 11, wherein the silicon-containing dielectric layer consists of silicon oxide, silicon nitride, silicon carbon nitride, or the arbitrary combinations thereof.

13. The method as claimed in claim 1, wherein the first contact opening and the second contact opening penetrate through both the interlayer dielectric layer and the etching stop layer and whereby exposing the substrate.

* * * * *